(12) United States Patent
Bollenbeck et al.

(10) Patent No.: US 8,249,688 B2
(45) Date of Patent: Aug. 21, 2012

(54) METHOD FOR AFFIXING A MAGNETIC RESONANCE RF COIL TO A PATIENT

(75) Inventors: Jan Bollenbeck, Eggolsheim (DE); Wolfgang Renz, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 13/302,331

(22) Filed: Nov. 22, 2011

(65) Prior Publication Data

US 2012/0071750 A1    Mar. 22, 2012

Related U.S. Application Data

(62) Division of application No. 12/120,856, filed on May 15, 2008, now abandoned.

(30) Foreign Application Priority Data

May 16, 2007    (DE) .......................... 10 2007 023 028

(51) Int. Cl.
     *A61B 5/055*      (2006.01)

(52) U.S. Cl. ......... 600/421; 600/422; 324/318; 324/322

(58) Field of Classification Search .................. 600/410, 600/421–422; 324/307, 309, 318, 322
See application file for complete search history.

(56) References Cited

U.S. PATENT DOCUMENTS

| | | | | |
|---|---|---|---|---|
| 4,874,203 A | * | 10/1989 | Henley | 297/250.1 |
| 5,158,932 A | * | 10/1992 | Hinshaw et al. | 505/162 |
| 5,983,426 A | * | 11/1999 | Vanek et al. | 5/621 |
| 6,350,129 B1 | * | 2/2002 | Gorlick | 439/37 |
| 2007/0240260 A1 | * | 10/2007 | White et al. | 5/81.1 R |

* cited by examiner

*Primary Examiner* — Ruth S Smith
(74) *Attorney, Agent, or Firm* — Schiff Hardin LLP

(57) ABSTRACT

In a method to affix RF coils (in particular local coils) on a patient in examinations with a magnetic resonance apparatus, a horizontal board accommodates the patient for a magnetic resonance examination to be implemented, an RF coil that has coil electronics is affixed with a fastening strap on the patient, and the fastening strap has a connection cable integrated therewith. The coil electronics are supplied with energy via the integrated connection cable.

10 Claims, 4 Drawing Sheets

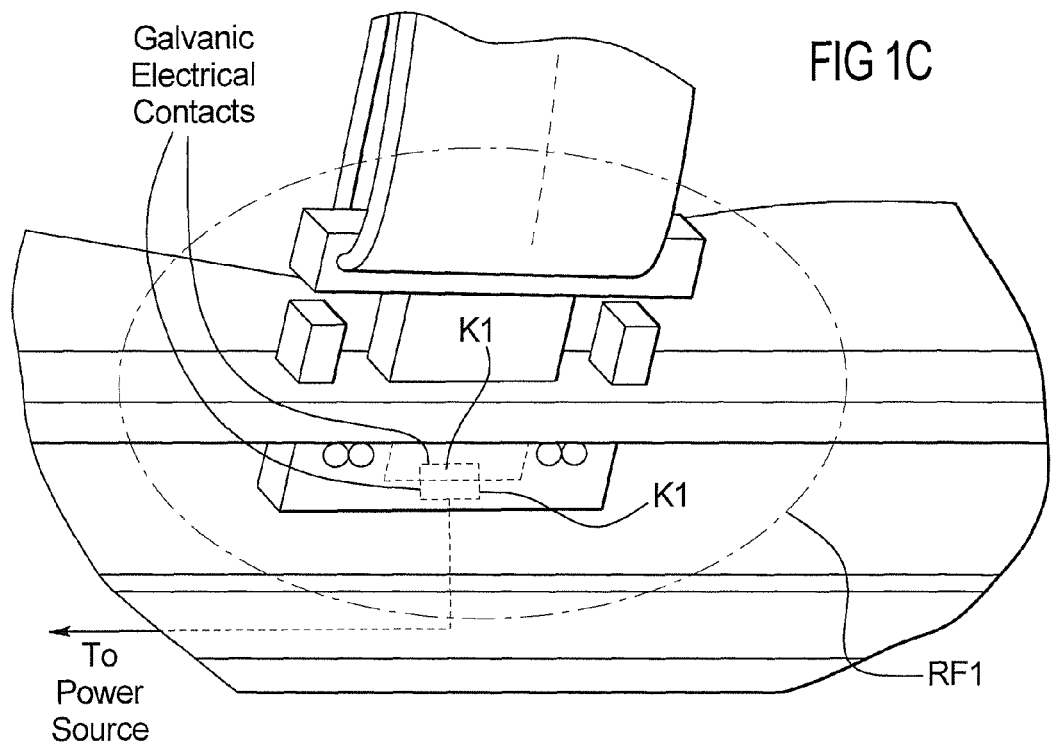
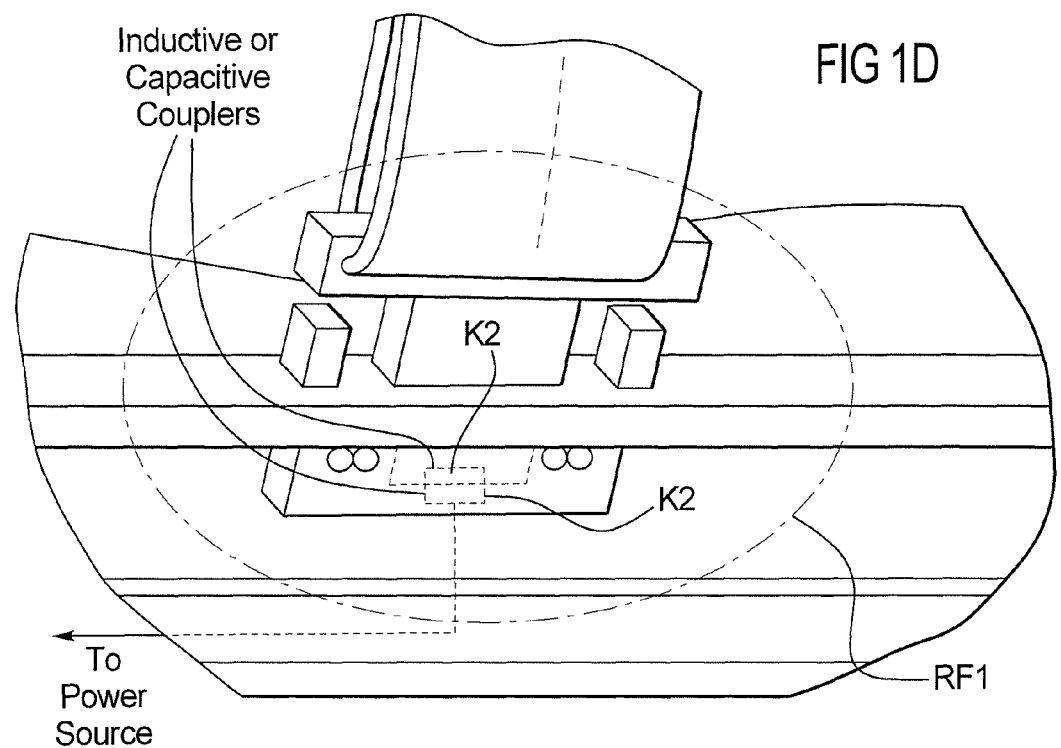

METHOD FOR AFFIXING A MAGNETIC RESONANCE RF COIL TO A PATIENT

RELATED APPLICATION

The present application is a divisional application of U.S. application Ser. No. 12/120,856 filed May 15, 2008 (now abandoned).

BACKGROUND OF THE INVENTION

1. Field of the Invention

The present invention concerns a method to affix an RF coil, in particular a local coil, on a patient for an examination with a magnetic resonance apparatus.

2. Description of the Prior Art

In a magnetic resonance examination, RF coils (in particular local coils) required to examine a patient are fastened on his body with the aid of straps or belts. Coils known as "under-coils" are placed on the horizontal board and have a rigid housing that is fashioned to accommodate the patient's weight. Coils known as "over-coils" are placed on the patient and are affixed on the body of the patient and on the horizontal board with the aid of fastening straps.

FIG. 2 shows such a magnetic resonance examination. A local coil LS is fastened or, affixed on the body of a patient P with the aid of a fastening strap BG. The local coil LS or its coil electronics module is electrically supplied via a relatively thick connection cable AK.

The connection cable AK is difficult to handle in combination with the local coil LS due to a (generally) large connection plug AS and interferes both during the examination and during the examination preparation.

Due to the necessity of connecting and disconnecting the connection plug AS before and after the examination, problems can occur in the reliability of the electrical connection via the connection plug AS.

In addition to the actual power supply of the coil electronics, the signal transfer from or to the local coil conductor also occurs via the connection cable AK.

At present concepts are under discussion to achieve the signal transmission wirelessly or with the use of optical fibers. Even with these concepts, however, it is still necessary to ensure the power supply to the coil electronics.

SUMMARY OF THE INVENTION

An object of the present invention is to provide a method to affix RF coils of a general type (but in particular local coils) on a patient in examinations with a magnetic resonance apparatus, which arrangement is improved with regard to handling.

This object is achieved in accordance with the invention by arrangement to affix RF coils on a patient in examinations with a magnetic resonance apparatus, wherein a horizontal board is used that serves to accommodate the patient for a magnetic resonance examination to be implemented.

Furthermore, at least one RF coil for the magnetic resonance examination is provided, the coil having coil electronics. The coil is affixed on the patient with the use of a fastening strap.

A connection or supply cable is an integrated part of the fastening strap via which the coil electronics are supplied with energy.

The necessity of the conventional, separate direction of the connection cable is foregone by the inventive combination of the fastening strap with the connection cable, such that the handling of the local coil with the connected supply or connection cable is made easier.

This is particularly advantageous in the use of multi-coil combinations given known as "body array" coils, and in the use of coils for angiography in the leg region, which are known as PAA coils.

In a preferred embodiment, fastening straps that can be fastened laterally at the horizontal board with a latching function (comparable to locking a seat belt in a vehicle) are used in the inventive arrangement.

Given the use of such fastening straps, electrical contracts are integrated within the mechanically designed latch connection.

Galvanically designed contacts can be used, or the electrical supply of the coils can ensue via inductive or capacitive coupling, comparable to charging devices that charge the batteries of an electrically operated toothbrush via coupling.

In another embodiment, the fastening strap contains capacitively or inductively designed signal couplers via which acquisition signals of the coils or local coils can be extracted. In this case a coupler counterpart is arranged on the top side of a coil housing, preferably below a fastening strap guide.

Due to low electrical requirements for the power supply, if such signals couplers are used it is possible to execute the connection plugs very simply. The operation of the connections is therefore further simplified.

In a preferred embodiment, the integrated connection cable is additionally used for data or measurement signal transfer of acquisition signals of the coils or local coils.

In a preferred development, data signals (that can be selected via filters in the individual coil housings) are then superimposed on the supply current.

BRIEF DESCRIPTION OF THE DRAWINGS

FIGS. 1A and 1B show an embodiment of the incentive arrangement for use in a magnetic resonance examination.

FIG. 1C is an enlargement of a portion of FIG. 1B, schematically illustrating an embodiment wherein electrical power is supplied via galvanic electrical contacts.

FIG. 1D is an enlargement of a portion of FIG. 1B, schematically illustrating a further embodiment wherein power is supplied via inductive or capacitive couplers.

DESCRIPTION OF THE PREFERRED EMBODIMENTS

Figure 1A:
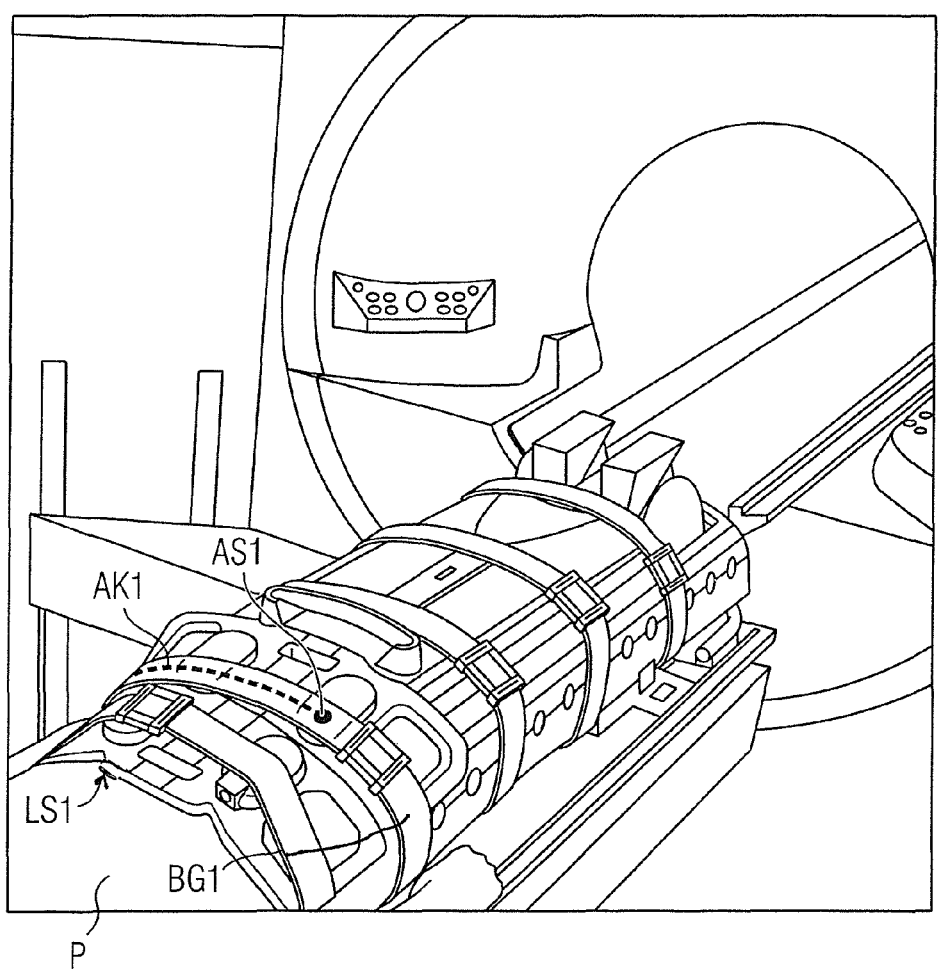
FIGS. 1A and 1B show an embodiment of the inventive arrangement for use in a magnetic resonance examination.

FIG. 1A shows the inventive arrangement for use in a magnetic resonance examination of a patient P.

A local coil LS1 is fastened or affixed on the body of the patient P with the aid of a fastening strap BG1. The local coil LS1 or its coil electronics is electrically supplied via a connection cable AK1.

The connection cable AK1 is an integrated part of the fastening strap BG1 or is connected with the fastening strap BG1 for guidance.

For example, it can be arranged within a fastening strap (not shown here) designed with a tube shape or, as shown here, it is connected with the fastening strap with the aid of loops that are components of the fastening strap BG1. Both the fastening strap BG1 and the connection cable AK1 are thus directed together.

The electrical supply of the local coil LS1 (more precisely of its coil electronic) here ensues via galvanically designed contacts with the use of a connection plug AS1.

Figure 1B:
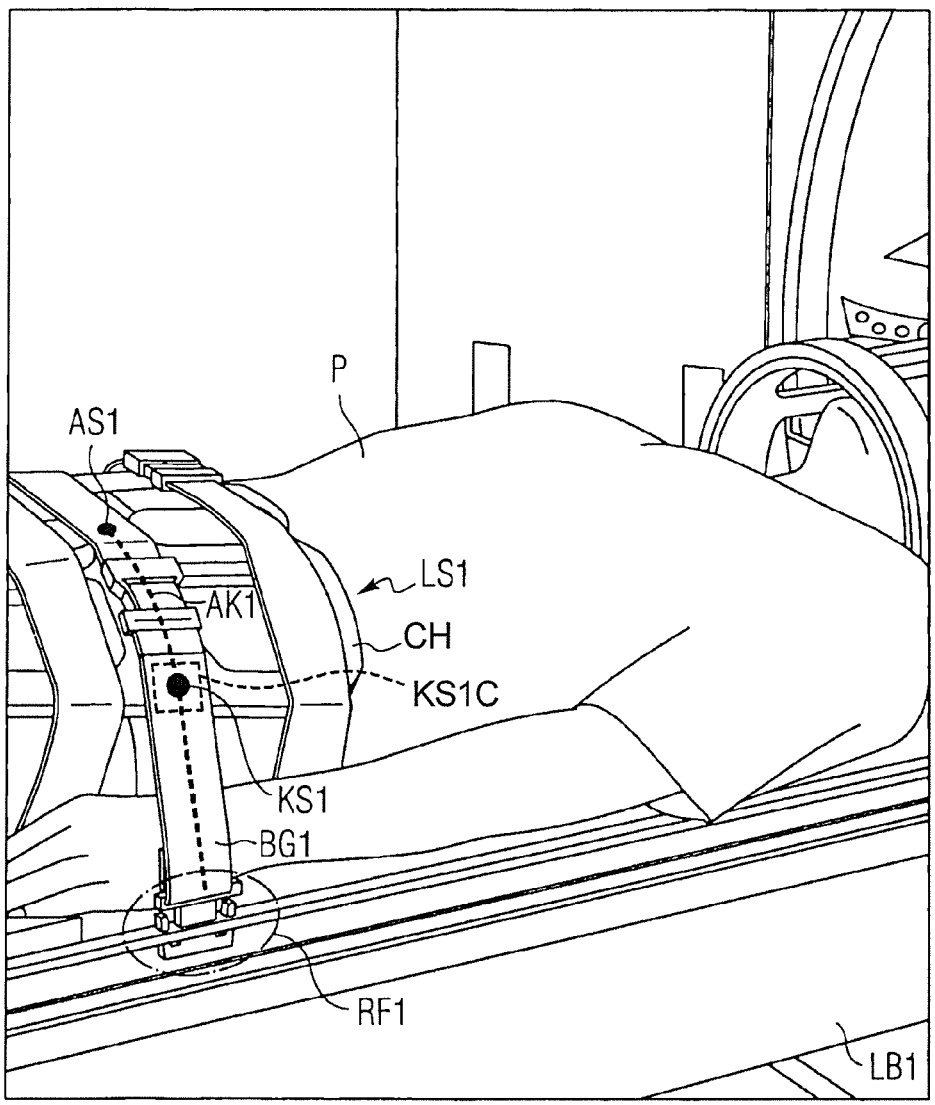
Figure 2:
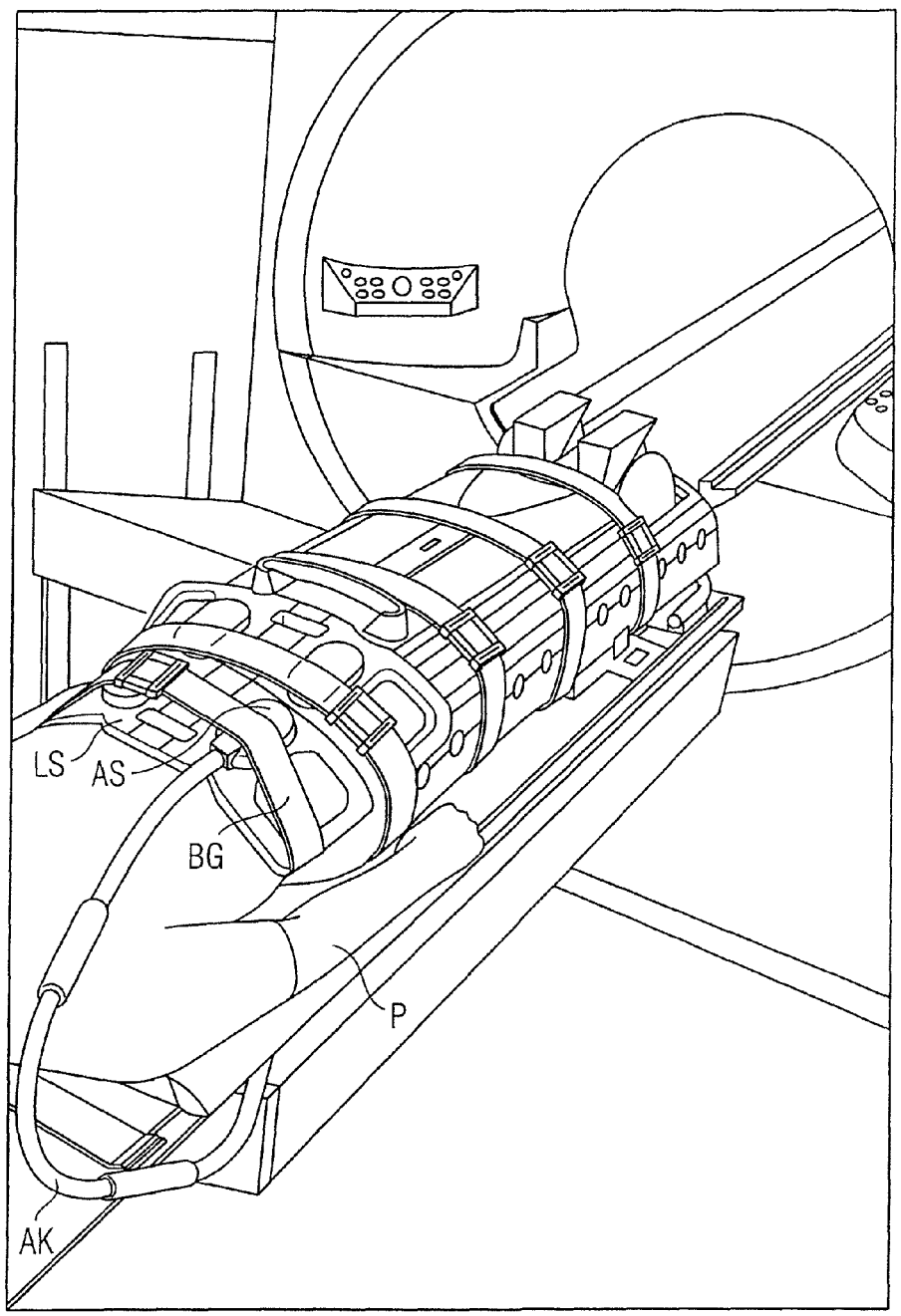
FIG. 2 illustrates the prior art described in the introduction in a magnetic resonance examination.

FIG. 1B shows further details of the invention with reference to FIG. 1A.

The fastening strap BG1 is laterally fastened on a horizontal board LB1 with a latch connection RF1 that has a latching function comparable to the catch of a safety belt in a vehicle.

The mechanically designed latch connection RF1 moreover has additional electrical contacts K1 (FIG. 1C via which the power supply of the connection cable AK1 can ensue via the horizontal board LB1.

The electrical supply of the local coil LS1 here ensues via galvanically designed contacts with the use of the connection plug AS1.

As an alternative, the power supply of the coil electronics of the local coil LS1 can ensue using inductive or capacitive couplers K2 (FIG. 1D). These couplers are designed comparable to charging devices that charge batteries of an electrically operated toothbrush via coupling.

In a further embodiment, the fastening strap BG1 additionally contains an integrated signal coupler KS1 that is capacitively or inductively designed.

Acquisition signals of the local coil LS1 are injected from the local coil LS1 into the connection cable AK1 via this signal coupler KS1.

A coupler counterpart KS1C for the signal coupler KS1 is arranged on the top side of a coil housing CH of the local coil LS1.

The coupler counterpart is preferably arranged below a fastening strap guide such that the coupler counterpart is mechanically pressed onto the signal coupler KS1 by the fastening strap BG1.

The transfer of the acquisition signals of the local coil LS1 to the signal coupler KS1 of the fastening strap BG1 ensues via this coupler counterpart.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method to affix an RF coil on a patient for a magnetic resonance examination using the RF coil, comprising:
   horizontally supporting a patient on a support surface for implementing a magnetic resonance examination of the patient;
   providing an RF coil for use in said magnetic resonance examination, said coil having coil electronics physically associated therewith;
   affixing the RF coil to the patient with a fastening strap connected to the coil and to said support surface; and
   supplying power to said coil electronics via a connection cable integrated with said fastening strap.

2. A method as claimed in claim 1 comprising connecting said fastening strap to said support surface with a latch connection.

3. A method as claimed in claim 2 comprising integrating electrical contacts in said latch connection via which said power is supplied to said coil electronics.

4. A method as claimed in claim 3 comprising forming said contacts as galvanic contacts.

5. A method as claimed in claim 1 comprising placing said connection cable integrated with said fastening strap in communication with said RF coil electronics via a connection selected from the group consisting of a galvanic connection, inductive coupling elements and capacitive coupling elements.

6. A method as claimed in claim 1 comprising integrating a signal coupler with said connection cable integrated with said fastening strap and, via said signal coupler, transferring electrical signals between the RF coil electronics and the connection cable.

7. A method as claimed in claim 6 comprising employing, as said integrated signal coupler, a signal coupler selected from the group consisting of capacitive couplers and inductive couplers.

8. A method as claimed in claim 7 wherein said RF coil has a housing comprising a coupler counterpart, and connecting the signal coupler to the coupler counterpart to transfer said signals between the RF coil electronics and the signal coupler.

9. A method as claimed in claim 8 comprising locating said coupler counterpart below a fastening strap guide and thereby pressing the fastening strap onto the signal coupler.

10. A method as claimed in claim 1 comprising said RF coil as a local coil.

* * * * *